(12) United States Patent
Tian et al.

(10) Patent No.: US 11,672,093 B2
(45) Date of Patent: Jun. 6, 2023

(54) CABLE LEAD-OUT SYSTEM

(71) Applicant: CommScope Technologies LLC, Hickory, NC (US)

(72) Inventors: Xiaohua Tian, Jiangsu (CN); Junfeng Yu, Jiangsu (CN); Zhaohui Liu, Jiangsu (CN)

(73) Assignee: CommScope Technologies LLC, Hickory, NC (US)

( * ) Notice: Subject to any disclaimer, the term of this patent is extended or adjusted under 35 U.S.C. 154(b) by 15 days.

(21) Appl. No.: 17/345,207

(22) Filed: Jun. 11, 2021

(65) Prior Publication Data

US 2022/0007529 A1 Jan. 6, 2022

(30) Foreign Application Priority Data

Jul. 1, 2020 (CN) .......................... 202021264653.8

(51) Int. Cl.
*H05K 5/02* (2006.01)
(52) U.S. Cl.
CPC .................... *H05K 5/0247* (2013.01)
(58) Field of Classification Search
None
See application file for complete search history.

(56) References Cited

U.S. PATENT DOCUMENTS 7,288,730 B2 * 10/2007 Habel ...................... H02G 3/22
  174/152 G
9,106,066 B2 * 8/2015 Sakakura ........... H01R 13/5808
(Continued)

FOREIGN PATENT DOCUMENTS

DE      202004011202 U1    11/2005
EP          3485547 A1     5/2019
WO    WO-2018010777 A1 *   1/2018  ............. H02G 3/088

OTHER PUBLICATIONS

"Partial European Search Report corresponding to European Application No. 21182712.6".
(Continued)

*Primary Examiner* — Xanthia C Cunningham
(74) *Attorney, Agent, or Firm* — Myers Bigel, P.A.

(57) ABSTRACT

The present invention relates to a cable lead-out system, configured to route at least one cable from inside of a device to outside of the device, wherein the cable lead-out system comprises: a first pressing piece having at least one through hole for leading out the cable; a second pressing piece having at least one through hole for leading out the cable; and a seal having a base sandwiched between the first pressing piece and the second pressing piece with two opposite sides thereof, and being deformable when being pressed by the first pressing piece and the second pressing piece, having the base comprising at least one through hole for leading out the cable, and at least one protrusion that protrudes from at least one of the two sides of the base, and each of the at least one protrusion being disposed around a through hole of the base, whereby the through hole of the base passes throughout the protrusion, wherein each of the at least one protrusion completely passes through a corresponding through hole of the first pressing piece or a corresponding through hole of the second pressing piece. The cable lead-out system can protect the cable sheaths from being scratched by metal parts.

19 Claims, 8 Drawing Sheets

(56) References Cited

U.S. PATENT DOCUMENTS

| | | | |
|---|---|---|---|
| 10,014,678 B2* | 7/2018 | Barrett | H02G 15/105 |
| 10,700,502 B2* | 6/2020 | Mechler | H02G 3/22 |
| 2010/0059941 A1* | 3/2010 | Beele | F16L 5/10 |
| | | | 277/606 |
| 2010/0187371 A1* | 7/2010 | Milton | H02G 3/22 |
| | | | 248/74.1 |
| 2010/0320694 A1* | 12/2010 | Gromotka | B29C 45/14385 |
| | | | 277/316 |
| 2013/0176401 A1* | 7/2013 | Monari | H04N 5/222 |
| | | | 348/157 |
| 2013/0277105 A1* | 10/2013 | Spilker | H02G 3/22 |
| | | | 174/653 |
| 2014/0138920 A1 | 5/2014 | Munroe et al. | |
| 2014/0265157 A1 | 9/2014 | Mukai et al. | |
| 2016/0005516 A1* | 1/2016 | Okuhara | B60R 16/0222 |
| | | | 174/650 |
| 2018/0045338 A1* | 2/2018 | Karlsson | H02G 3/22 |
| 2018/0277981 A1* | 9/2018 | Miura | H01R 13/5208 |
| 2018/0366865 A1* | 12/2018 | Garcia | H01R 13/665 |
| 2019/0123540 A1* | 4/2019 | Nakamura | H02G 3/22 |
| 2019/0128501 A1* | 5/2019 | Chen | F21V 5/04 |
| 2019/0157776 A1* | 5/2019 | Castillo | H01R 4/70 |
| 2019/0326739 A1* | 10/2019 | Nowastowski-Stock | |
| | | | H02G 3/0406 |
| 2019/0351849 A1* | 11/2019 | Suenaga | B60R 16/0222 |
| 2019/0380214 A1* | 12/2019 | Sasaki | H05K 5/0247 |
| 2020/0315049 A1* | 10/2020 | Hsieh | H05K 7/20145 |
| 2022/0200256 A1* | 6/2022 | Burghard | H01B 17/26 |

OTHER PUBLICATIONS

"Extended European Search Report corresponding to European Application No. 21182712.6 dated Feb. 18, 2022".

* cited by examiner

CABLE LEAD-OUT SYSTEM

RELATED APPLICATION

The present application claims priority from and the benefit of Chinese Utility Model Application No. 202021264653.8, filed Jul. 1, 2020, the disclosure of which is hereby incorporated by reference herein in full.

FIELD OF THE INVENTION

The present invention relates to a cable lead-out system.

BACKGROUND OF THE INVENTION

In the prior art, typically a cable is not directly led out from inside to outside of a base station antenna, but instead a jumper is first led from a phaser inside the base station antenna to a connector on an inner surface of a cover of the base station antenna, then another jumper is provided to lead from a connector on an outer surface of the cover of the base station antenna to a remote radio unit (RRU), which increases the number of jumpers and connectors.

Cables are welded to the phaser inside the base station antenna, such that if the cables are not securely fixed, the solder joints may be damaged.

Since cables are usually in direct contact with the metal parts, cable sheaths may be easily scratched and have stress concentrations at the contact portions, thereby risking damage.

SUMMARY OF THE INVENTION

Therefore, embodiments of the present invention are intended to provide a cable lead-out system by which at least one of said technical problems existing in the prior art can be solved.

Embodiments of the present invention relate to a cable lead-out system, configured to route at least one cable from inside of a device to outside of the device, wherein the cable lead-out system comprises:

a first pressing piece having at least one through hole for leading out the cable, a second pressing piece having at least one through hole for leading out the cable, and a seal having:

a base sandwiched between the first pressing piece and the second pressing piece with two opposite sides thereof, and being deformable when being pressed by the first pressing piece and the second pressing piece, the base comprising at least one through hole for leading out the cable, and at least one protrusion that protrudes from at least one of the two sides of the base, and each of the at least one protrusion being disposed around a through hole of the base, whereby the through hole of the base passes throughout the protrusion, wherein each of the at least one protrusion completely passes through a corresponding through hole of the first pressing piece or a corresponding through hole of the second pressing piece.

In some embodiments, each of the at least one protrusion has a tapered structure in a direction away from the base.

In some embodiments, the through hole of the first pressing piece or the second pressing piece passed through by the at least one protrusion has a tapered structure adapted to the tapered structure.

In some embodiments, the seal has a plurality of protrusions disposed symmetrically on the two sides of the base of the seal.

In some embodiments, the first pressing piece, the second pressing piece and the seal are provided with through holes for passage of connecting elements therethrough at a circumference of a group of through holes for passage of the cables therethrough, the connecting elements being configured to pass through these through holes for passage of the connecting elements to fix and press the first pressing piece, the second pressing piece and the seal.

In some embodiments, the first pressing piece has a flange extending from a periphery thereof toward the seal, the flange surrounding the seal and spaced apart from the seal by a radial distance.

In some embodiments, the cable lead-out system further comprises a retainer plate having a central through hole, the seal having a central boss, and the central boss of the seal being adapted to be embedded into the central through hole of the retainer plate.

In some embodiments, the second pressing piece has a plate-like shape, and abuts a top surface of the central boss of the seal and one side of the retainer plate with the same side thereof.

In some embodiments, the retainer plate has through holes for passage of connecting elements therethrough in an outer circumferential area thereof, by means of which the retainer plate being connected to a housing of the device.

In some embodiments, the retainer plate further has through holes for passage of connecting elements therethrough in an inner circumferential area thereof, and the second pressing piece has corresponding through holes for passage of the connecting elements, such that connecting elements are able to pass through the retainer plate and the second pressing piece to have them fixed together.

In some embodiments, the through holes for passage of the connecting elements therethrough of the second pressing piece are provided on lugs at both ends of the second pressing piece.

In some embodiments, the first pressing piece has through holes for passage of the connecting elements therethrough such that the connecting elements are able to pass through the first pressing piece, the retainer plate and the second pressing piece to have three fixed together.

In some embodiments, the central boss of the seal has a height greater than a thickness of the retainer plate.

In some embodiments, before the first and second pressing pieces press the seal, the retainer plate abuts on a portion of a side surface of the central boss of the seal, whereas another portion of the side surface of the central boss of the seal protrudes beyond the retainer plate.

In some embodiments, after the first and second pressing pieces press the seal, due to a flow of a sealing material of the seal, the another portion of the side surface of the central boss of the seal is inclined toward the retainer plate and forms an angle of less than 90 degrees therewith.

In some embodiments, the tapered structure is a conical structure.

In some embodiments, the adapted tapered structure is a conical structure.

In some embodiments, the protrusions are arranged in one row, multiple rows, or circumferentially.

In some embodiments, before the first and second pressing pieces press the seal, the at least one through hole of the seal for leading out the cable is in slight interference fit with the cable.

In some embodiments, the two sides of the base of the seal are in surface contact with the first and second pressing pieces, respectively.

In some embodiments, the two sides of the base of the seal lie completely against or in other words, lie with entire surfaces thereof against the first and second pressing pieces, respectively.

A person skilled in the art will understand advantages of corresponding embodiments and various additional embodiments by reading the following detailed description of the corresponding embodiments with reference to the drawings as included below.

BRIEF DESCRIPTION OF THE DRAWINGS

Embodiments of the present invention are further described as below with reference to the accompanying drawings and embodiments, wherein.

DETAILED DESCRIPTION OF PREFERRED EMBODIMENTS

Figure 1:
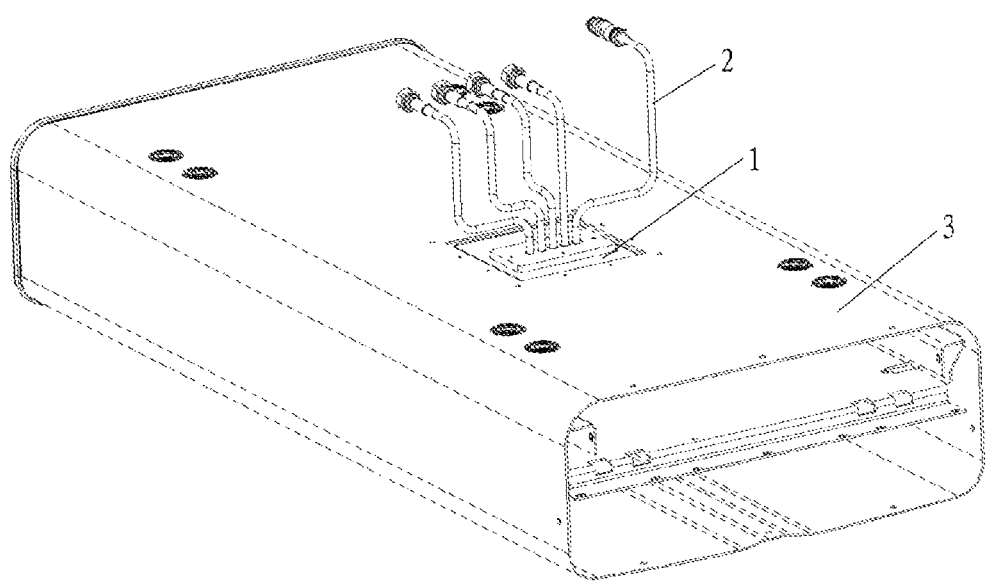
FIG. 1 shows a schematic perspective view of a cable lead-out system mounted to a cover of a base station antenna according to a first embodiment of the present invention.

Embodiments of the present invention will be described below with reference to the drawings, in which several embodiments of the present invention are shown. It should be understood, however, that the present invention may be presented in various different manners, not limited to the embodiments described below. In fact, the embodiments described below are intended to make the disclosure of the present invention more complete and to adequately explain the protection scope of the present invention to a person skilled in the art. It should also be understood that, the embodiments disclosed herein can be combined in various ways to provide more additional embodiments.

It should be understood that, in all the drawings, the same reference signs denote the same elements. In the drawings, the size of certain features may be modified for the purpose of clarity.

It should be understood that, the wording in the description is only used for describing particular embodiments and is not intended to define the present invention. All the terms used in the description (including technical terms and scientific terms), have the meanings as normally understood by a person skilled in the art, unless otherwise defined. For the purpose of conciseness and/or clarity, the well-known functions or constructions may not be described in detail any longer.

The singular forms "a/an", "said" and "the" as used in the description, unless clearly indicated, all contain the plural forms. The wordings "comprising", "encompassing" and "containing" used in the description indicate the presence of the claimed features, but do not repel the presence of one or more other features. The wording "and/or" as used in the description includes any and all combinations of one or more of the relevant items listed. The phases "between X and Y" and "between about X and Y" as used in the description should be construed as including X and Y. The phrase "between about X and Y" as used in the present description means "between about X and about Y", and the phrase "from about X to Y" as used in the present description means "from about X to about Y".

In the description, when one element is referred to as being "on" another element, "attached to" another element, "connected" to another element, "coupled" to another element, or "in contact with" another element, the element may be directly located on another element, attached to another element, linked to another element, or in contact with another element, or there may be present with an intermediate element. By contrast, where one element is referred to as being "directly" on another element, "directly attached to" another element, "directly connected to" another element, "directly coupled" to another element, or "in direct contact with" another element, there will not be present with an intermediate element. In the description, where one feature is arranged to be "adjacent" to another feature, it may mean that one feature has a portion that overlaps with an adjacent feature or a portion that is located above or below an adjacent feature.

In the description, the spatial relation wordings such as "upper", "lower", "left", "right", "front", "rear", "high", "low" may describe a relation of one feature with another feature in the drawings. It should be understood that, the spatially relation wordings also encompass different orientations of the device in use or operation in addition to encompassing the orientations shown in the drawings. For example, when the device in the drawings is turned over, the features previously described as "below" other features may be described to be "above" other features at this time. The device may also be otherwise oriented (rotated 90 degrees or at other orientations). At this time, the relative spatial relations will be explained correspondingly.

The cable lead-out system 1 of the present invention can be used to route one or more cables 2 from inside of a device to outside of the device. The device may be, for example, a base station antenna, where the cable lead-out system 1 can be used to lead one or more cables 2 from inside of the base station antenna to outside of the base station antenna. The cables 2 may be, for example, electric cables, optical cables, or the like. In sense of the present invention, the term "inside of a device" or "inside of a base station antenna" can be understood as an internal space defined by a housing of the device or a cover 3 of the base station antenna, and the term "outside of a device" or "outside of a base station antenna" can be understood as an external environment outside the housing of the device or the cover 3 of the base station antenna.

Figure 2:
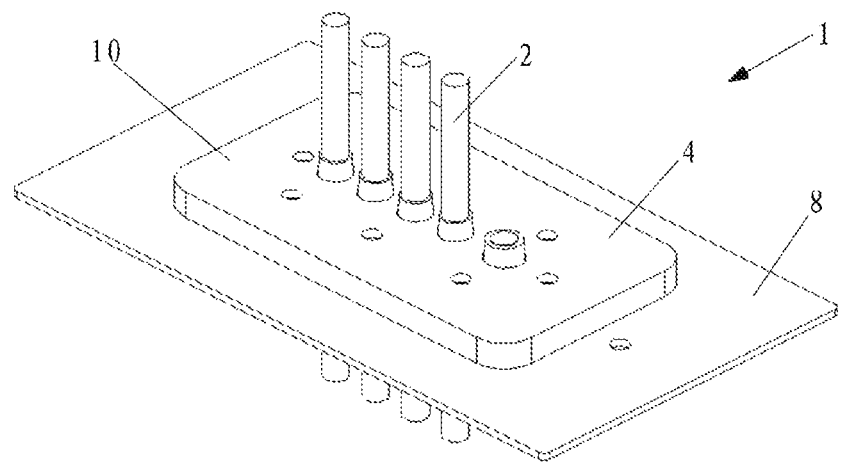
FIG. 2 shows a schematic perspective view of the cable lead-out system as shown in FIG. 1.
Figure 3:
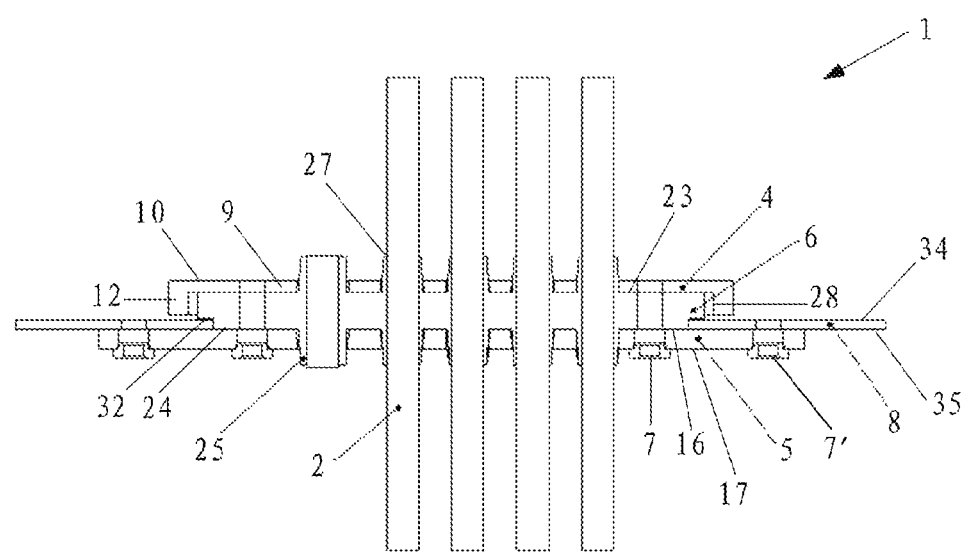
FIG. 3 shows a schematic cross-sectional view of the cable lead-out system as shown in FIG. 1, wherein a seal has not been pressed by outer and inner pressing pieces.

A first embodiment of the cable lead-out system 1 of the present invention will be described with reference to FIGS. 1 to 7. FIG. 1 shows a schematic view of the cable lead-out system 1 mounted to a cover 3 of a base station antenna, and FIGS. 2 and 3 show a schematic perspective view and a schematic cross-sectional view of the cable lead-out system 1, respectively. As can be generally seen from FIGS. 1 to 3, the cable lead-out system 1 may comprise, in a mounted state, an outer pressing piece 4 located outside of the base station antenna, an inner pressing piece 5 located inside of the base station antenna and a seal 6 therebetween. The outer pressing piece 4 and the inner pressing piece 5 can be connected by connecting elements 7, for example, screws, bolts, or the like, such that the seal 6 can be pressed by pressing pieces 4, 5.

The cable lead-out system 1 may further comprise a retainer plate 8 which, on one hand, can be connected to the inner pressing piece 5 through connecting elements 7', and on the other hand, can be connected to a cover 3 of the base station antenna through connecting elements that are the same as or different from the connecting elements 7', whereby the cable outlet system 1 can be secured in an opening (not shown) on a back surface of the cover 3 of the base station antenna. One or more (five in the first embodiment) cables 2 can be routed out of the base station antenna to the outside of the base station antenna through the cable lead-out system 1.

The structural details of each component and how they are fitted to one another are explained below with reference to the drawings.

Figure 4:
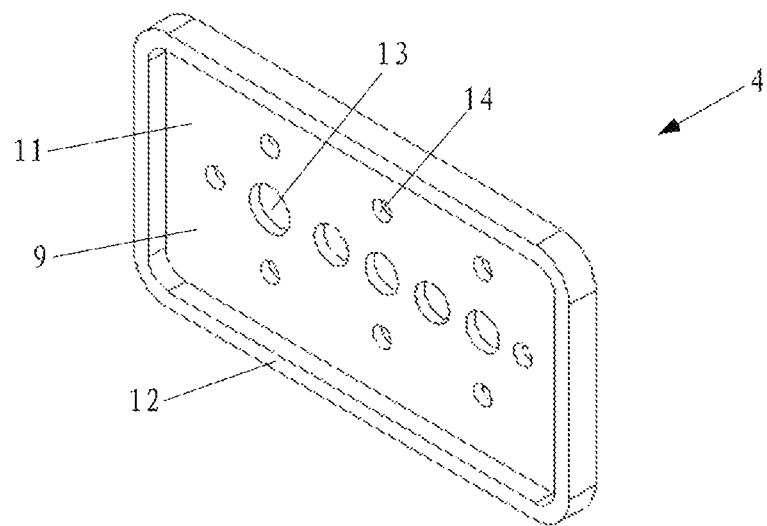
FIG. 4 shows a schematic perspective view of an outer pressing piece of the cable lead-out system as shown in FIG. 1.

FIG. 4 shows a schematic perspective view of the outer pressing piece 4. The outer pressing piece 4 may be made of metal, for example stainless steel. The outer pressing piece 4 may have a plate-shaped base 9, and the base 9 may, in the mounted state, have an outer side 10 (see FIG. 3) facing the outside of the base station antenna and an inner side 11 facing the seal 6. The outer pressing piece 4 may further have a flange 12 extending perpendicularly to the inner side 11 from a periphery of the inner side 11 of the base 9.

The base 9 of the outer pressing piece 4 may have a generally rectangular shape. The rectangular shape may have its four corners rounded. In another embodiment, the base 9 of the outer pressing piece 4 may basically be in a square, circular, oval, triangular or any other polygonal shape.

The base 9 of the outer pressing piece 4 may be provided with through holes 13 for leading out cables 2, and each through hole 13 may allow one cable 2 to pass therethrough. In the illustrated embodiment, there are five through holes 13, and these through holes 13 may be arranged in a row parallel to a long side of the base 9. In another embodiment, the number of the through holes 13 may be one or more rather than five. In another embodiment, the through holes 13 may be arranged in multiple rows, circumferentially, in a honeycomb or any other possible manner.

The base 9 of the outer pressing piece 4 may also be provided with through holes 14 allowing passage therethrough of connecting elements 7. The connecting elements 7 may be, for example, screws, bolts, threaded rods or the like. Connecting elements 7 passing through these through holes 14 can not only securely fix the outer pressing piece 4 and the inner pressing piece 5 together, but also tightly press the seal 6 therebetween. The through holes 14 may be arranged around a group of through holes 13. For example, three through holes 14 may be provided on each side of the group of through holes 13, and one through hole 14 may be provided on each end of the group of through holes 13. In another embodiment, the number and arrangement of the through holes 14 can also be adjusted as required.

Figure 5:
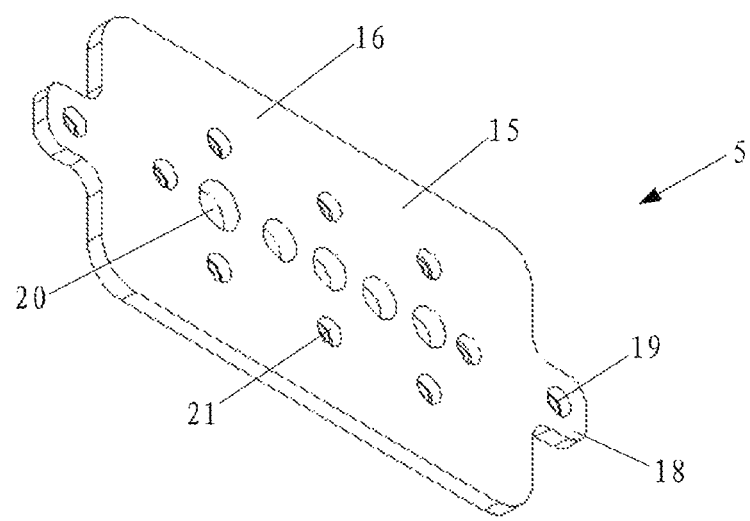
FIG. 5 shows a schematic perspective view of an inner pressing piece of the cable lead-out system as shown in FIG. 1.

FIG. 5 shows a schematic perspective view of the inner pressing piece 5. The inner pressing piece 5 may be made of metal, for example stainless steel. The inner pressing piece 5 may have a plate-shaped base 15, and the base 15 may, in the mounted state, have an outer side 16 facing the outside of the base station antenna and an inner side 17 facing the inside of the base station antenna (see FIG. 3).

The inner pressing piece 5 may also have a lug 18 extending from each end of the base 15 and coplanar with the base 15. Referring to FIG. 3, each lug 18 can extend beyond the seal 6 and the outer pressing piece 4 in the mounted state. Each lug 18 may be provided with a through hole 19 for connecting the inner pressing piece 5 to the retainer plate 8 by means of connecting elements 7', such as screws, bolts, or the like, as can be seen in FIG. 3.

The base 15 of the inner pressing piece 5 corresponds to the base 9 of the outer pressing piece 4 in shape. For example, the base 15 of the inner pressing piece 5 may have a generally rectangular shape. The rectangular shape may have its four corners rounded. In another embodiment, the base 15 of the inner pressing piece 5 may basically be in a square, circular, oval, triangular or any other polygonal shape.

The base 15 of the inner pressing piece 5 may be provided with through holes 20 for leading out cables 2. The number of through holes 20 and arrangement thereof on the inner pressing piece 5 correspond to the number of through holes 13 and arrangement thereof on the outer pressing piece 4. For example, in the illustrated embodiment, there are five through holes 20, and the through holes 20 may be arranged in a row parallel to a long side of the base 15. In another embodiment, the number of the through holes 20 of the inner pressing piece 5 may be one or more rather than five, corresponding to the through holes 13 of the outer pressing piece 4. In another embodiment, the through holes 20 of the inner pressing piece 5 may be arranged in multiple rows, circumferentially, in a honeycomb or any other possible manner, corresponding to the through holes 13 of the outer pressing piece 4.

The base 15 of the inner pressing piece 5 may also be provided with through holes 21 allowing passage therethrough of connecting elements 7. Connecting elements 7 passing through the through holes 14 and the through holes 21 can not only securely fix the outer pressing piece 4 and the inner pressing piece 5 together, but also tightly press the seal 6 therebetween. The number of through holes 21 and arrangement thereof on the inner pressing piece 5 correspond to the number of through holes 14 and arrangement thereof on the outer pressing piece 4. The through holes 21 may be arranged around the through holes 20. For example, three through holes 21 may be provided on each side of a group of through holes 20, and one through hole 21 may be provided on each end of the group of through holes 20. In another embodiment, the number and arrangement of the through holes 21 can also be adjusted as actually required.

Figure 6:
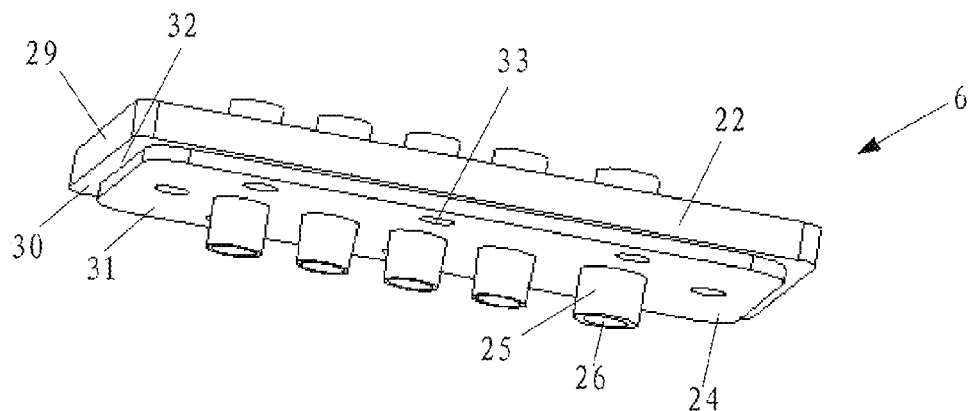
FIG. 6 shows a schematic perspective view of the seal of the cable lead-out system as shown in FIG. 1.

FIG. 6 shows a schematic perspective view of the seal 6. The seal may be made of an elastic material, such as rubber. As can be seen from the figure thereof, the seal 6 may have a basically plate-shaped base 22, and the base 22 may, in the mounted state, have an outer side 23 facing the outer pressing piece 4 and an inner side 24 facing the inner pressing piece 5 (see FIG. 3). In the mounted state, the inner side 11 of the base 9 of the outer pressing piece 4 can contact and press the outer side 23 of the base 22 of the seal 6, and the outer side 16 of the base 15 of the inner pressing piece 5 can contact and press the inner side 24 of the base 22 of the seal 6. The outer side 23 and the inner side 24 of the base 22 of the seal 6 can lie completely against or in other words, lie with entire surfaces thereof against the inner side 11 of the base 9 of the outer pressing piece 4 and the outer side 16 of the base 15 of the inner pressing piece 5, respectively.

The base 22 of the seal 6 corresponds to the bases 9, 15 of the pressing pieces 4, 5 in shape. For example, the base 22 of the seal 6 may basically have a rectangular shape. In another embodiment, the base 22 of the seal 6 may basically be in a square, circular, oval, triangular or any other polygonal shape.

The base 22 of the seal 6 may be provided with through holes 26 for routing cables 2. The number of through holes 26 and arrangement thereof on the seal 6 correspond to the number of through holes 13 and arrangement thereof on the outer pressing piece 4, and the number of through holes 20 and arrangement thereof on the inner pressing piece 5. For example, in the illustrated embodiment there are five through holes 26 of the seal 6, and these through holes 26 may be arranged in a row parallel to a long side of the base 22. In another embodiment, the number of the through holes 26 of the seal 6 may be one or more rather than five, corresponding to the through holes 13, 20 of the pressing pieces 4, 5. In another embodiment, the through holes 26 of the seal 6 may be arranged in multiple rows, circumferentially, in a honeycomb or any other possible manner, corresponding to the through holes 13, 20 of the pressing pieces 4, 5. The through holes 26 may have an identical diameter or different diameters, which can be selected according to diameters of the cables 2 to be led out therethrough.

Protrusions 25 may protrude outward from the outer side 23 and the inner side 24 around the through holes 26 of the seal 6 such that the through holes 26 may pass continuously through the protrusions 25. The protrusions 25 on the inner side 24 and the protrusions 25 on the outer side 23 may have the same number, and may be symmetrical with respect to the base 22 of the seal 6. In another embodiment, the protrusions 25 may be provided only on one side of the base 22.

Referring to FIG. 3, in the mounted state, the protrusions 25 of the seal 6 can completely pass through the through holes 13, 20 of the pressing pieces 4, 5. The term "completely pass through" in the sense of the present invention may mean that, in the mounted state, free ends 27 of the protrusions 25 away from the base 6 of the seal 6 can be flush with or extend beyond the outer side 10 of the outer pressing piece 4 or the inner side 17 of the inner pressing piece 5. As such, the cables 2 passing through the through holes 26 of the seal 6 may not contact the metal outer pressing piece 4 or inner pressing piece 5, but can only contact the protrusions 25 made of an elastic material, whereby the risk of the cable sheaths being scratched by the metal pressing pieces 4, 5 is avoided, and the stress concentration at the pressing pieces 4, 5 when the cables 2 are bent can be reduced, thereby increasing the number of times the cables 2 can be bent.

Referring to FIG. 6, the protrusions 25 of the seal 6 may have a conical structure tapered away from the base 22 of the seal 6. Correspondingly, the through holes 13, 20 of the pressing pieces 4, 5 may have a conical structure adapted to the conical structure of the protrusions 25. This conical structure design is advantageous because when the pressing pieces 4, 5 press the seal 6, the protrusions 25 of the seal 6 are subject to a radially inward force component, such that the protrusions 25 can hug the cables 2 more tightly to thereby prevent undesired sliding of the cables 2 in the through holes 26 of the seal 6 in the mounted state. In another embodiment, the protrusions 25 of the seal 6 may have a tapered, non-conical structure away from the base 22, for example, a polygonal tapered structure. Correspondingly, the through holes 13, 20 of the pressing pieces 4, 5 may have a polygonal tapered structure adapted to the polygonal tapered structure of the protrusions 25.

Before the pressing pieces 4, 5 press the seal 6, that is, in a relaxed state of the seal 6, the through holes 26 of the seal 6 can be slightly interference-fitted with the cables 2, and this slight interference fit can prevent a free sliding of the cables 2 accommodated therein due to gravity, while it allows a mounting technician to manually move the cables 2 in the through holes 26 as needed, thereby facilitating the mounting process. After the pressing pieces 4, 5 press the seal 6, that is, in a pressed state of the seal 6, as described above, the cables 2 can be tightly fixed in the through holes 26 of the seal 6, and the cables 2 cannot be moved even if they are manually pulled, which greatly increases the fixed reliability of the cables 2 in the mounted state.

The inner side 11 of the base 9 of the outer pressing piece 4 may be larger than the outer side 23 of the base 22 of the seal 6. Before the seal 6 is pressed, an inner circumferential surface 28 of the flange 12 of the outer pressing piece 4 may be disposed to surround an outer circumferential surface 29 of the base 22 of the seal 6 at a distance such that a flow of a material of the seal in a direction toward the flange 12 during the seal 6 being pressed by the pressing pieces 4, 5 is not hindered by the inner circumferential surface 28 of the flange 12. After the pressing pieces 4 and 5 press the seal 6, the distance can be reduced or be reduced to zero. Such a structural design is advantageous in sealing of the pressing pieces 4, 5 and the retainer plate 8 in a circumferential direction after the seal 6 is pressed.

The base 22 of the seal 6 may be provided with a central boss 31 at a central portion of the inner side 24 thereof. The central boss 31 is surrounded by an edge portion 30 of the inner side surface 24 and protrudes relative to the edge portion 30. Referring to FIG. 3, before the pressing pieces 4, 5 press the seal 6, a height of a portion of the seal 6 from the outer side 23 to the edge portion 30 of the inner side 24 may be higher than a height of the inner circumferential surface 28 of the flange 12 of the outer pressing piece 4. After the pressing pieces 4, 5 press the seal 6, due to the flow of the material of the seal 6, a height distance therebetween can be reduced or be reduced to zero.

The base 22 of the seal 6 may be provided with through holes 33 allowing passage therethrough of connecting elements 7. The number of through holes 33 and arrangement thereof on the seal 6 correspond to the number of through holes 21 and arrangement thereof on the inner pressing piece 5, and the number of through holes 14 and arrangement thereof on the inner pressing piece 4. The through holes 33 may be arranged around a group of through holes 26. For example, three through holes 33 may be provided on each side of the group of through holes 26, and one through hole 33 may be provided on each end of the group of through holes 26. As such, the connecting elements 7 for connecting the outer pressing piece 4 and the inner pressing piece 5 also pass through the seal 6, respectively. This can not only provide a fixed connection of the three, but also fully press the sealing material around the cables 2 so as to securely fix the cables 2.

Figure 7:
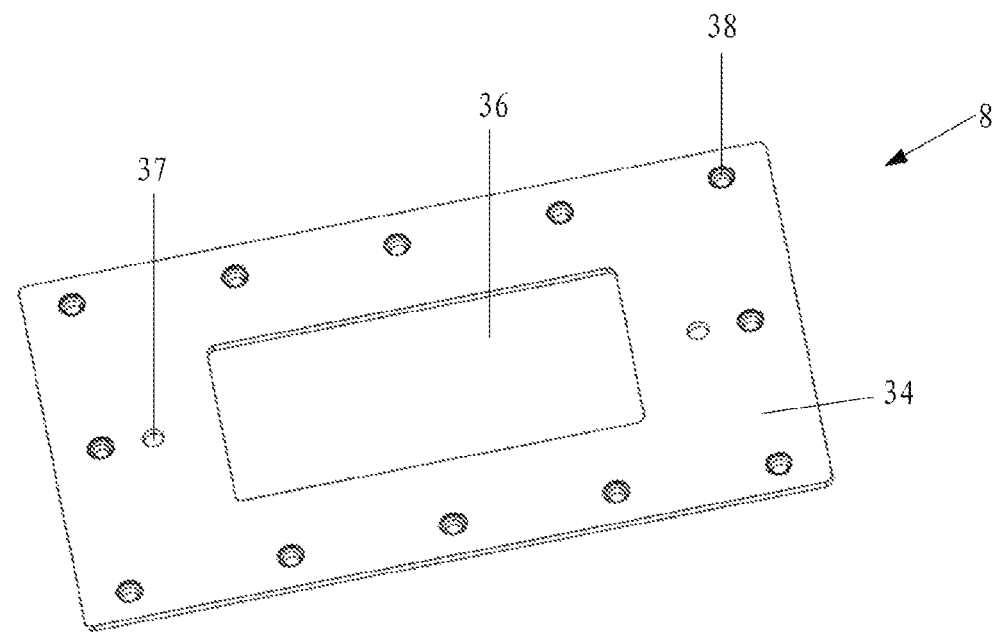
FIG. 7 shows a schematic perspective view of a retainer plate of the cable lead-out system as shown in FIG. 1.
Figure 8:
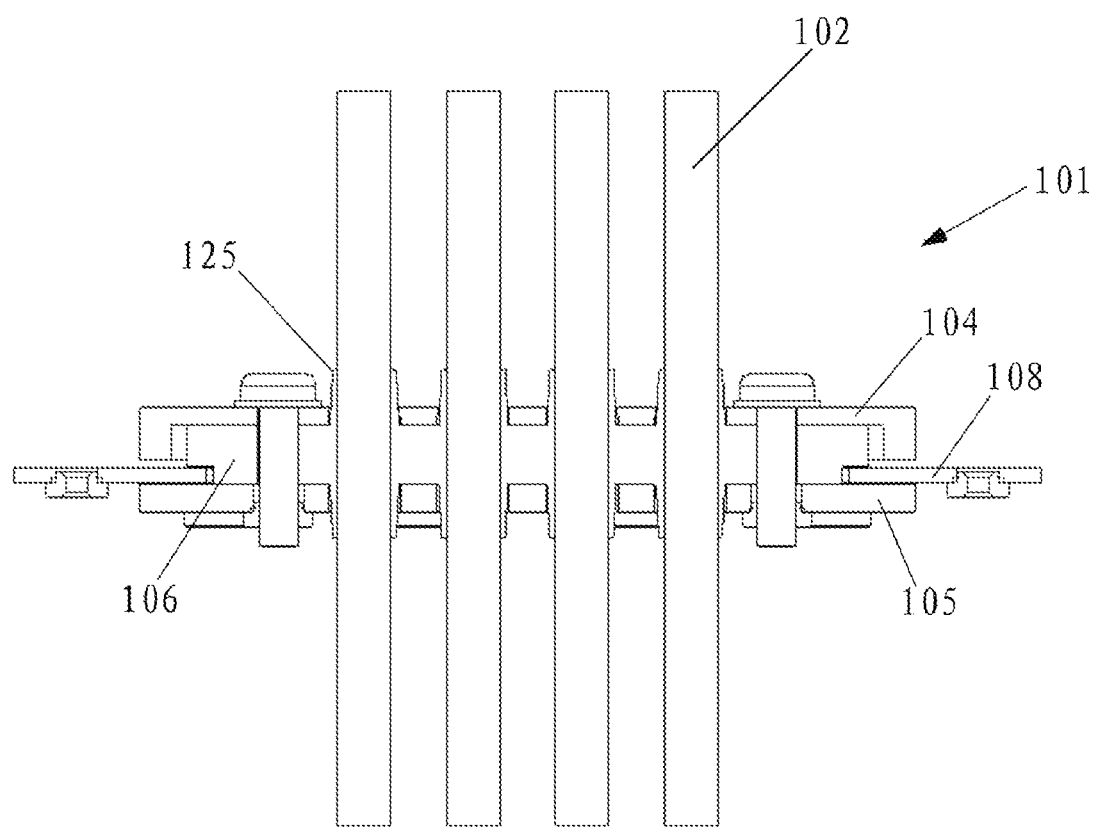
FIG. 8 shows a schematic cross-sectional view of the cable lead-out system according to a second embodiment of the present invention, wherein a seal has not been pressed by outer and inner pressing pieces.

FIG. 7 shows a schematic perspective view of the retainer plate 8. The retainer plate 8 may be made of metal, for example stainless steel. As can be seen from the figure, the retainer plate 8 may have a plate-like shape, and may have two completely symmetrical sides 34, 35.

The retainer plate 8 may also be provided with a central through hole 36 in a center thereof, and the central through hole 36 may have a shape adapted to the shape of the central boss 31 of the base 22 of the seal 6. The central through hole 36 has a cross section that can be slightly larger than the cross section of the central boss 31 of the base 22 of the seal 6. In the mounted state, the central boss 31 of the base 22 of the seal 6 may be embedded into the central through hole 36 of the retainer plate 8. After the pressing pieces 4, 5 press the seal 6, due to the flow of the sealing material, the central through hole 36 of the retainer plate 8 is completely filled by the seal 6. The retainer plate 8 has a thickness that can be substantially equal to a height of the central boss 31 of the base 22 of the seal 6. In the mounted state, the inner side 24 of the seal 6 can be on the same plane as the inner side 35 of the retainer plate 8 and both can abut against the outer side 16 of the inner pressing piece 5, as can be seen in FIG. 3.

The retainer plate 8 may basically have a rectangular shape. In another embodiment, the retainer plate 8 may basically be in a square, circular, triangular or any other polygonal shape, independent of the shape of the outer pressing piece 4, the inner pressing piece 5 or the seal 6.

The retainer plate 8 may be provided with through holes 37 allowing passage therethrough of connecting elements 7'. The number of through holes 37 and arrangement thereof on the retainer plate 8 correspond to the number of through holes 19 and arrangement thereof on the inner pressing piece 5. For example, each end of the retainer plate 8 may be provided with a through hole 37 for passage of one connecting member 7' therethrough, such that the inner pressing piece 5 and the retainer plate 8 are fixed together through the connecting elements 7', as can be seen in FIGS. 3 and 7.

Besides, the retainer plate 8 may also be provided with through holes 38 for passage therethrough of connecting elements that are the same as or different from the connecting elements 7', so as to fix the retainer plate 8 to the cover 3 of the base station antenna. The through holes 38 may be provided at a portion of the retainer plate 8 that protrudes beyond the inner pressing piece 5 in the mounted state. For example, these through holes 38 may be provided at an entire peripheral portion of the retainer plate 8. In another embodiment, the number and arrangement of the through holes 38 can also be adjusted as required.

A second embodiment of a cable lead-out system 101 according to the present invention will be described with reference to FIGS. 8 to 12. In the cable lead-out system 101, like or similar structure will be denoted by a reference numeral by adding 100 to the reference numeral as in the cable lead-out system 1. Differences from the first embodiment are mainly described here, whereas similarities thereto are omitted.

In the first embodiment, the retainer plate 8 may only be connected to the inner pressing piece 5, but not to the outer pressing piece 4, whereas in the second embodiment, the retainer plate 108 may be simultaneously connected to the outer pressing piece 104 and to the inner pressing piece 105, and for this purpose, the outer pressing piece 104 may also be provided with through holes 139 for connecting to the retainer plate 108. Compared with the first embodiment, these additional through holes 139 can connect the outer pressing piece 104 and the inner pressing piece 105 to each other more securely, and can further press the seal 106 to thereby enhance the sealing effect of the seal 106 against the pressing pieces 104, 105 and the retainer plate 108 in a circumferential direction.

Figure 9:
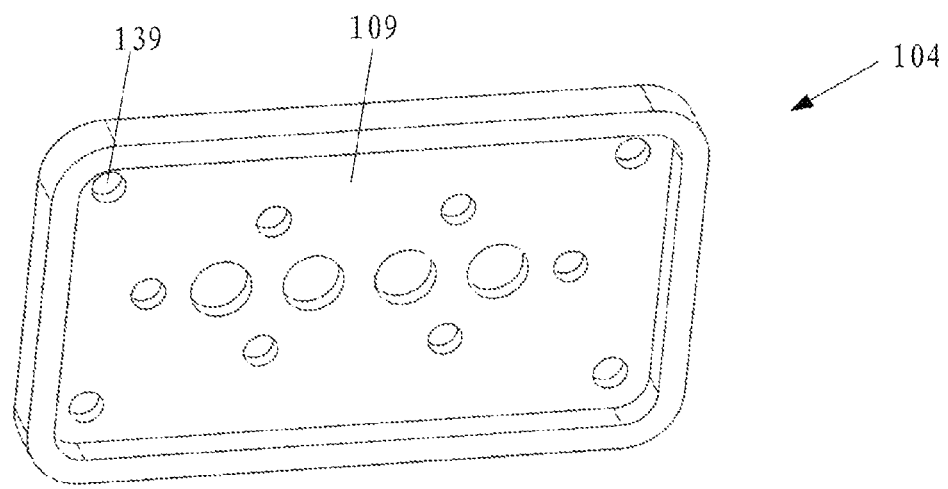
FIG. 9 shows a schematic perspective view of an outer pressing piece of the cable lead-out system as shown in FIG. 8.
Figure 10:
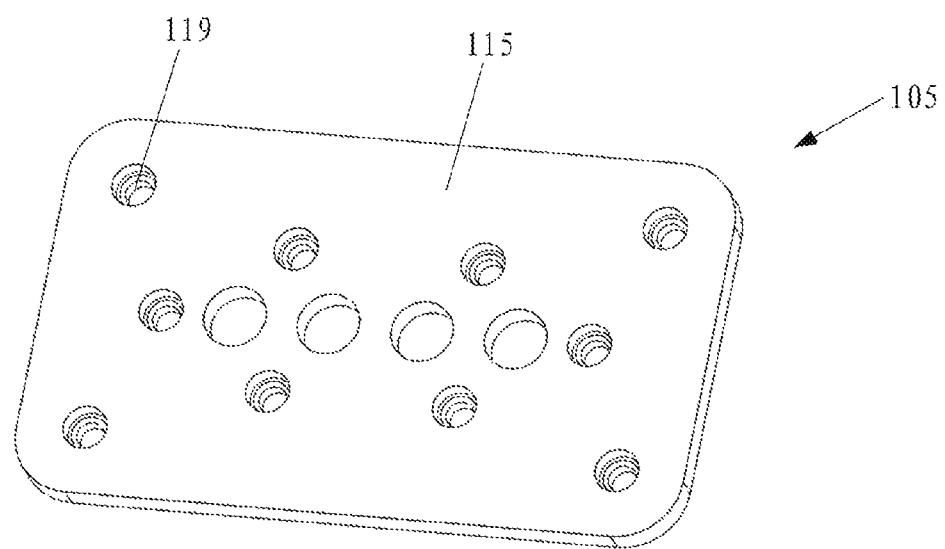
FIG. 10 shows a schematic perspective view of an inner pressing piece of the cable lead-out system as shown in FIG. 8.
Figure 11:
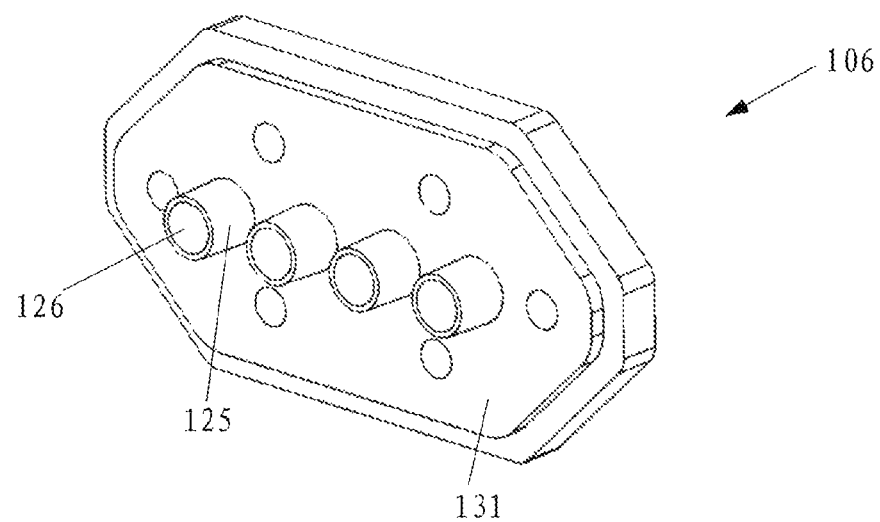
FIG. 11 shows a schematic perspective view of the seal of the cable lead-out system as shown in FIG. 8.
Figure 12:
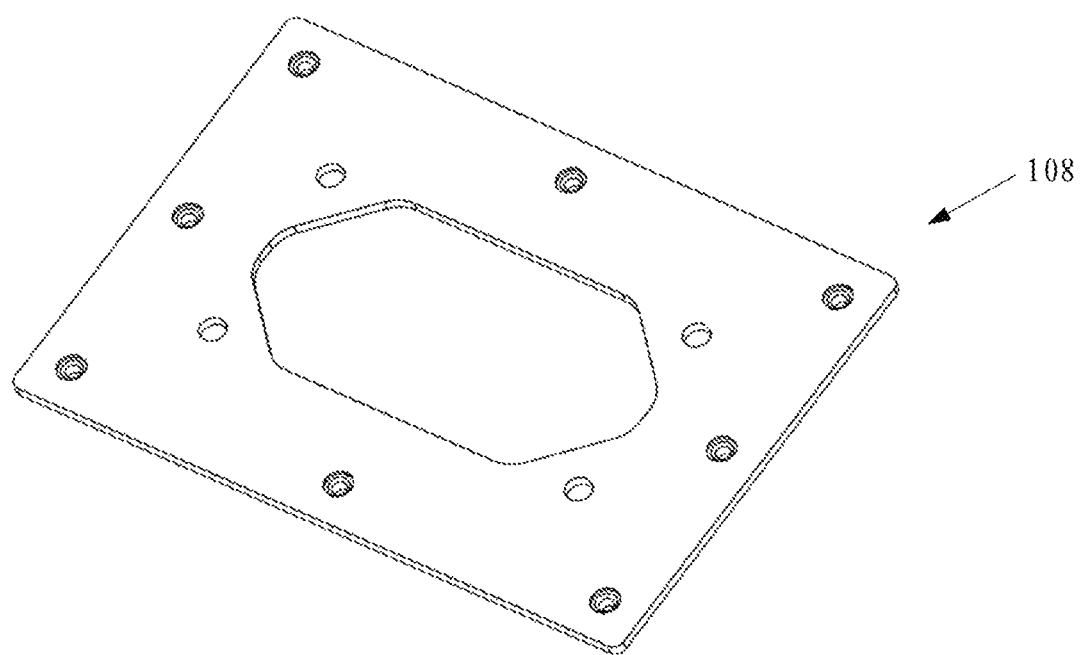
FIG. 12 shows a schematic perspective view of a retainer plate of the cable lead-out system as shown in FIG. 8.

In the second embodiment, four such through holes 139 may be provided on the outermost periphery (i.e., at four corners) of the base 109 of the outer pressing piece 104, referring to FIG. 9. Four corresponding through holes 119 may be provided on the outermost periphery (i.e., at four corners) of the base 115 of the inner pressing piece 105, referring to FIG. 10, whereby the lugs 18 of the inner pressing piece 5 in the first embodiment are omitted. In order to prevent the connecting elements passing through the through holes 119, 139 from passing through the seal 106, referring to FIG. 11, the seal 106 may basically have a hexagonal shape, such that the connecting elements passing through these through holes 119, 139 may bypass the seal 106. Such a design can save the material of the seal 106.

In the second embodiment, the structure of the central through hole 36 of the fixing plate 108 may correspond to the structure of the central boss 131 of the seal 106, and thus may have a hexagonal shape.

Further, unlike the first embodiment, the cable lead-out system 101 in the second embodiment can allow four cables 102 to pass therethrough.

A third embodiment of a cable lead-out system 201 according to the present invention will be described with reference to FIGS. 13 to 14. In the cable lead-out system 201, like or similar structure will be denoted by a reference numeral by adding 200 to the reference numeral as in the cable lead-out system 1. Differences from the first and second embodiments are mainly described here, whereas similarities thereto are omitted.

Figure 13:
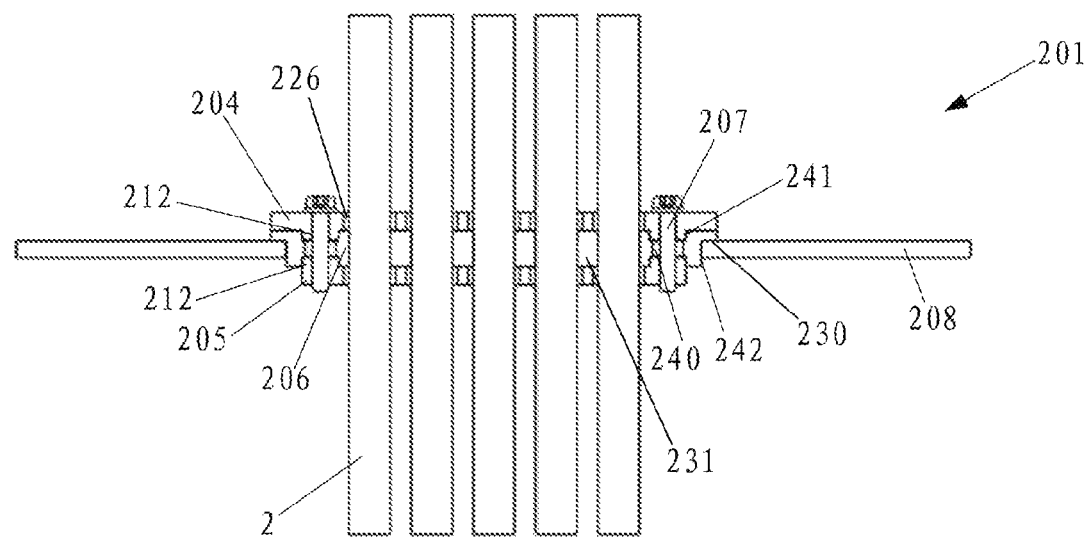
FIG. 13 shows a schematic cross-sectional view of the cable lead-out system according to a third embodiment of the present invention, wherein a seal has not been pressed by outer and inner pressing pieces.
Figure 14:
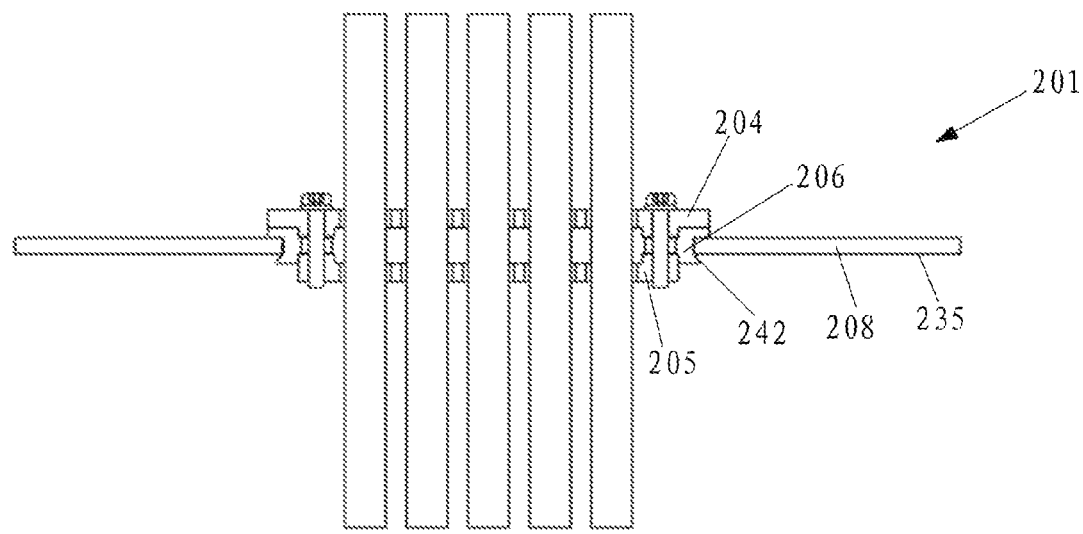
FIG. 14 shows a schematic cross-sectional view of the cable lead-out system according to the third embodiment of the present invention, wherein a seal has not been pressed by outer and inner pressing pieces.

Although protrusions on the pressing pieces 204, 205 are not shown in FIGS. 13 and 14 for the sake of clarity, protrusions are also included here.

As can be seen from the figures, unlike the first and second embodiments, in the third embodiment, the seal 206 may further have a circumferential thin portion 240 between the through holes 226 and the edge portion 230, and the circumferential thin portion 240 includes circumferential grooves 241 recessed from the outer side 223 and the inner side 224, respectively. The outer pressing piece 204 and the inner pressing piece 205 may each have a circumferential flange 212. In the mounted state, the flanges 212 may be embedded into the corresponding circumferential grooves 241. Corresponding through holes may be provided on the flanges 212 of the pressing pieces 204, 205 and on the circumferential thin portion 240 of the seal 206, and the connecting elements 207 may pass through the through holes to connect the pressing pieces 204, 205 and the seal 206 to each other.

Unlike the first and second embodiments, in the third embodiment, the retainer plate 208 may contact neither the outer pressing piece 204 nor the inner pressing piece 205, whereas the retainer plate 208 may only contact the seal 206, and particularly, can receive the central boss 231 of the seal 206.

Unlike the first and second embodiments, in the third embodiment, the height of the central boss 231 of the seal 206 may be greater than the thickness of the retainer plate 208.

Referring to FIG. 13, in the mounted state, before the pressing pieces 204, 205 press the seal 206, the retainer plate 208 may abut on a portion of the side surface of the central boss 231 of the seal 206, whereas another portion of the side surface 242 of the central boss 231 of the seal 206 may protrude beyond the inner side 235 of the retainer plate 208.

Referring to FIG. 14, in the mounted state, after the pressing pieces 204, 205 press the seal 206, due to the flow of the sealing material, another portion of the side surface 242 of the central boss 231 of the seal 206 protruding beyond the inner side 235 of the retainer plate 208 may be inclined toward the inner side 235 of the retainer plate 208 and may form an angle of less than 90 degrees therewith, such that the seal 206 together with the pressing pieces 204, 205 can be axially fixed relative to the retainer plate 208 in a direction toward the outside of the base station antenna. Compared with the fixing manner in the first and second embodiments, this fixing manner can reduce the number of connecting elements and the number of through holes to be formed in the corresponding components.

The cable lead-out system 1, 101, 201 according to the present invention has, but is not limited to, the following advantages: sealing the cables 2, 102, thereby preventing water from flowing into the base station antenna 3 along the cables 2, 102; sealing the outer pressing piece 4, 104, 204, the inner pressing piece 5, 105, 205 and the retainer plate 8, 108, 208, thereby preventing water from flowing into the base station antenna 3 along their contact portions; protecting the cables 2, 102 and preventing cable sheaths from contacting the metal outer pressing piece 4, 104, 204 or the inner pressing piece 5, 105, 205; releasing the stress concentration of the cables 2, 102, and allowing the cables 2, 102 to be only in contact with an elastic material, such as rubber; increasing the number of bends of the cables 2, 102; using tapered protrusions 25, 125 to further hold the cables 2, 102 firmly after the seal 6, 106, 206 is pressed to thereby prevent the cables 2, 102 from sliding; allowing free adjustment of the cables 2, 102 before the seal 6, 106, 206 is pressed; allowing the number of cables 2, 102 to be led-out to be increased as required.

The present invention may include any feature or combination of features implicitly or explicitly disclosed herein or a generic concept thereof, and is not limited to any defined scope as listed above. Any elements, features and/or structural arrangements described herein may be combined in any suitable manner.

The specific embodiments disclosed above are merely exemplary, and it will be apparent to those skilled in the art who benefit from the teachings herein that the present invention can be modified and implemented in different but equivalent manners. It is therefore obvious that variations and modifications can be made to the specific embodiments as disclosed above, and all these variants are considered to fall within the scope and spirit of the present invention.

What is claimed:

1. A cable lead-out system, configured to route at least one cable from inside of a device to outside of the device, comprising:
   a first pressing piece having at least one through hole for leading out the cable,
   a second pressing piece having at least one through hole for leading out the cable, and
   a seal having:
   a base sandwiched between the first pressing piece and the second pressing piece with two opposite sides thereof, and being deformable when being pressed by the first pressing piece and the second pressing piece, the base comprising at least one through hole for leading out the cable, and
   at least one protrusion that protrudes from at least one of the two sides of the base, and each of the at least one protrusion being disposed around a through hole of the base, whereby the through hole of the base passes throughout the protrusion,
   wherein each of the at least one protrusion completely passes through a corresponding through hole of the first pressing piece or a corresponding through hole of the second pressing piece,
   wherein the first pressing piece, the second pressing piece and the seal are provided with through holes for passage of connecting elements therethrough at a circumference of a group of through holes for passage of the cables therethrough, the connecting elements being configured to pass through the through holes for passage of the connecting elements to fix and press the first pressing piece, the second pressing piece and the seal.

2. The cable lead-out system according to claim 1, wherein each of the at least one protrusion has a tapered structure in a direction away from the base.

3. The cable lead-out system according to claim 2, wherein the through hole of the first pressing piece or the second pressing piece passed through by the at least one protrusion has a tapered structure adapted to the tapered structure.

4. The cable lead-out system according to claim 2, wherein the tapered structure is a conical structure.

5. The cable lead-out system according to claim 3, wherein the adapted tapered structure is a conical structure.

6. The cable lead-out system according to claim 1, wherein the seal has a plurality of protrusions disposed symmetrically on the two sides of the base of the seal.

7. The cable lead-out system according to claim 6, wherein the protrusions are arranged in one row, multiple rows, or circumferentially.

8. The cable lead-out system according to claim 1, wherein the first pressing piece has a flange extending from a periphery thereof toward the seal, the flange surrounding the seal and spaced apart from the seal by a radial distance.

9. The cable lead-out system according to claim 1, wherein before the first and second pressing pieces press the seal, the at least one through hole of the seal for leading out the cable is in slight interference fit with the cable.

10. The cable lead-out system according to claim 1, wherein the two sides of the base of the seal are in surface contact with the first and second pressing pieces, respectively.

11. A cable lead-out system, configured to route at least one cable from inside of a device to outside of the device, comprising:
    a first pressing piece having at least one through hole for leading out the cable,
    a second pressing piece having at least one through hole for leading out the cable, and
    a seal having:
    a base sandwiched between the first pressing piece and the second pressing piece with two opposite sides thereof, and being deformable when being pressed by the first pressing piece and the second pressing piece, the base comprising at least one through hole for leading out the cable, and at least one protrusion that protrudes from at least one of the two sides of the base, and each of the at least one protrusion being disposed around a through hole of the base, whereby the through hole of the base passes throughout the protrusion, wherein each of the at least one protrusion completely passes through a corresponding through hole of the first pressing piece or a corresponding through hole of the second pressing piece, wherein the cable lead-out system further comprises a retainer plate having a central through hole, the seal having a central boss, and the central boss of the seal being adapted to be embedded into the central through hole of the retainer plate.

12. The cable lead-out system according to claim 11, wherein the second pressing piece has a plate-like shape, and abuts a top surface of the central boss of the seal and one side of the retainer plate with the same side thereof.

13. The cable lead-out system according to claim 12, wherein the retainer plate has through holes for passage of connecting elements therethrough in an outer circumferential area thereof, by means of which the retainer plate being connected to a housing of the device.

14. The cable lead-out system according to claim 13, wherein the retainer plate further has through holes for passage of connecting elements therethrough in an inner circumferential area thereof, and the second pressing piece has corresponding through holes for passage of the connecting elements, such that connecting elements are able to pass through the retainer plate and the second pressing piece to have them fixed together.

15. The cable lead-out system according to claim 14, wherein the through holes for passage of the connecting elements therethrough of the second pressing piece are provided on lugs at both ends of the second pressing piece.

16. The cable lead-out system according to claim 14, wherein the first pressing piece has through holes for passage of the connecting elements therethrough such that the connecting elements are able to pass through the first pressing piece, the retainer plate and the second pressing piece to have three fixed together.

17. The cable lead-out system according to claim 11, wherein the central boss of the seal has a height greater than a thickness of the retainer plate.

18. The cable lead-out system according to claim 17, wherein before the first and second pressing pieces press the seal, the retainer plate abuts on a portion of a side surface of the central boss of the seal, whereas another portion of the side surface of the central boss of the seal protrudes beyond the retainer plate.

19. The cable lead-out system according to claim 18, wherein after the first and second pressing pieces press the seal, due to a flow of a sealing material of the seal, the another portion of the side surface of the central boss of the seal is inclined toward the retainer plate and forms an angle of less than 90 degrees therewith.

* * * * *